United States Patent [19]
Poechmueller et al.

[11] Patent Number: 6,018,483
[45] Date of Patent: Jan. 25, 2000

[54] DISTRIBUTED BLOCK REDUNDANCY FOR MEMORY DEVICES

[75] Inventors: Peter Poechmueller, Munich, Germany; Armin Reith, Wappingers Falls, N.Y.

[73] Assignee: Siemens Aktiengesellschaft, Munich, Germany

[21] Appl. No.: 09/209,199

[22] Filed: Dec. 10, 1998

[51] Int. Cl.$^7$ .................................................. G11C 7/00
[52] U.S. Cl. ..................................... 365/200; 365/230.03
[58] Field of Search ................................. 365/200, 230.03

[56] References Cited

U.S. PATENT DOCUMENTS

| | | | |
|---|---|---|---|
| 5,355,339 | 10/1994 | Oh et al. | 365/200 |
| 5,475,648 | 12/1995 | Fujiwara | 365/230.06 |
| 5,491,664 | 2/1996 | Phelan | 365/200 |
| 5,691,946 | 11/1997 | DeBrosse et al. | 365/200 |
| 5,831,913 | 11/1998 | Kirihata | 365/200 |
| 5,831,914 | 11/1998 | Kirihata | 365/200 |
| 5,881,003 | 3/1999 | Kirihata et al. | 365/200 |

*Primary Examiner*—David Nelms
*Assistant Examiner*—Gene N. Auduong
*Attorney, Agent, or Firm*—Donald B. Paschburg

[57] ABSTRACT

A memory bank, in accordance with the present invention includes a plurality of memory sub-units, each memory sub-unit being divided by sense amplifier banks wherein adjacent memory sub-units share the sense amplifier bank therebetween. Redundancy regions are also included which are disposed in the memory sub-units and sharing circuitry therewith. The redundancy regions are located at a first end portion and a second end portion of the memory bank, the first and second end portions being disposed at opposing ends of the memory bank. A central sense amplifier bank is disposed between a first half and a second half of the memory bank wherein failed devices in the first half of the memory bank are replaced by a device in the redundancy region at the first end portion and failed devices in the second half of the memory bank are replaced by a device in the redundancy region at the second end portion such that sense amplifier contention is prevented for the central sense amplifier bank. Also, a method for replacing failed devices is disclosed.

22 Claims, 3 Drawing Sheets

DISTRIBUTED BLOCK REDUNDANCY FOR MEMORY DEVICES

BACKGROUND

1. Technical Field

This disclosure relates to semiconductor memories and more particularly, to a distributed block redundancy device and method for providing redundant circuits for semiconductor circuits.

2. Description of the Related Art

Semiconductor memory chips, for example dynamic random access memory chips (DRAM), are typically provided with redundant row/column lines to provide backup circuits in situations where a row/column line fails or is working improperly. The redundant row/column or redundancy is used to access sense amplifiers and therefore memory cells that would have otherwise been lost due to the defective row/column line.

Conventional redundancy schemes for memory circuits may be categorized into two types. These are a distributed redundancy approach and a block redundancy approach. The distributed redundancy approach is typically more area efficient, but less flexible. The block redundancy has a larger area impact and more flexibility.

Referring to FIG. 1, an illustrative memory device 10 is shown for implementing block redundancy. A 16 megabit (M) memory block or bank 12 includes 16, 1 M blocks 14. Each block 14 includes 512 wordlines WL. A faulty wordline, that is any of the 8,192 (512×16) or so wordlines, may be replaced by a redundant wordline RWL in a redundancy block 20. In this example, 40 wordline replacements are possible for a 16 M memory. The 40 wordline replacements in redundancy block 20 include logical replacements in regions 21 where one logical element corresponds to one physical wordline. This approach permits replacement of any faulty wordline of block 12 making this approach very flexible. The flexibility is provided by using a block redundancy, however the block redundancy requires its own sense amplifier 23. The sense amplifier 23 requires a relatively large area, and this is particularly noticeable in memory devices having a large number of banks since each bank requires its own redundant block.

Referring to FIG. 2, an illustrative memory device 30 is shown for implementing distributed redundancy. In a distributed redundancy approach, redundant elements are evenly distributed over a large number of relatively small sub-units. In this example, each 1 M unit 32 has 8 spare wordlines which can replace any failing wordline within the 1 M unit. One logical element corresponds to 1 physical wordline. Sense amplifiers are disposed in regions 33.

Although the repair domain can be increased, a problem may arise if multiple wordlines are activated. FIG. 2 additionally illustrates a repair over a 4 M domain as indicated. Since a neighboring 1 M unit 32' to the 4 M region has an active wordline 34, sense amplifier contention may occur in sense amplifier 33a because a wordline has to be sensed at both sides of the sense amplifier which is generally not possible. To avoid this situation the maximum repair region is reduced to 2 M. In designs with a large number of bits per bitline and numerous memory banks, the distributed redundancy approach often results in sense amplifier sharing problems.

Therefore, a need exists for a redundancy scheme requiring less area and having a larger repair domain. A further need exists for a replacement scheme that does not result in sense amplifier contention.

SUMMARY OF THE INVENTION

A memory bank, in accordance with the present invention includes a plurality of memory sub-units, each memory sub-unit being divided by sense amplifier banks wherein adjacent memory sub-units share the sense amplifier bank therebetween. Redundancy regions are also included which may be disposed in the memory sub-units. The redundancy regions are located at a first end portion and a second end portion of the memory bank, the first and second end portions being disposed at opposing ends of the memory bank. A central sense amplifier bank is disposed between a first half and a second half of the memory bank wherein failed devices in the first half of the memory bank are replaced by a device in the redundancy region at the first end portion and failed devices in the second half of the memory bank are replaced by a device in the redundancy region at the second end portion such that sense amplifier contention is prevented for the central sense amplifier bank.

Another memory bank, in accordance with the present invention, includes a plurality of memory sub-units, each memory sub-unit being divided by sense amplifier banks wherein adjacent memory sub-units share the sense amplifier bank therebetween. A first redundancy is disposed within a first memory sub-unit and employed for replacing failed devices in the first memory sub-unit and a second memory sub-unit adjacent to the first memory sub-unit. A second redundancy is disposed within a fourth memory sub-unit and employed for replacing failed devices in the fourth memory sub-unit and a third memory sub-unit adjacent to the fourth memory sub-unit. The first memory sub-unit and the fourth memory sub-unit are separated by the second and third memory sub-units. Also, the second and third memory sub-units share a central sense amplifier bank therebetween wherein the failed devices are replaced by redundant devices which use sense amplifier banks other than the central sense amplifier bank.

In alternate embodiments, the redundancy regions include word lines. Each memory sub-unit may include 1, 4, 16 or more megabits of memory. The memory bank may further include a repair domain of one half of a total memory of the bank. Each redundancy region may include 8 to 32 redundant wordlines per 4 megabits of memory. Each redundancy region includes logic circuitry and the logic circuitry is preferably shared between the redundancy region and the memory sub-unit in which the redundancy region is disposed. The redundancy regions preferably share sense amplifiers with the memory sub-unit in which the redundancy region is disposed.

In other embodiments, the first and second redundancy may include 8 to 32 redundant wordlines per 4 megabits of memory. The first redundancy may include logic circuitry, the logic circuitry being shared between the first redundancy and the first sub-unit. The second redundancy may include logic circuitry, the logic circuitry being shared between the second redundancy and the fourth sub-unit. The first redundancy preferably shares sense amplifiers with the first sub-unit and the second redundancy preferably shares sense amplifiers with the fourth sub-unit.

A method for replacing failed devices in semiconductor memories includes the steps of providing a memory bank including a plurality of memory sub-units, each memory sub-unit being divided by sense amplifier banks wherein adjacent memory sub-units share the sense amplifier bank therebetween, providing redundancy regions in the memory sub-units at a first end portion and a second end portion of the memory bank, the first and second end portions being disposed at opposing ends of the memory bank, preventing sense amplifier contention of a central sense amplifier bank disposed between a first half and a second half of the memory bank by replacing failed devices in the first half of the memory bank by replacing the failed device by a device in the redundancy region at the first end portion and replacing failed devices in the second half of the memory bank by replacing the failed device by a device in the redundancy region at the second end portion.

In other methods, the step of sharing circuitry and devices between the redundancy regions and the memory sub-unit in which the redundancy region is located may be included. The redundancy regions preferably include word lines. The step of providing a repair domain of one half of a total memory of the device by implementing the method may also be included.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor memories and more particularly, to a novel distributed block redundancy bank and method for providing redundant circuits for semiconductor memory circuits. In accordance with the present invention, redundant circuitry is distributed within memory sub-units, and no separate redundant memory region having it own sense amplifier is needed. Redundant circuitry is advantageously clustered to increase repair flexibility and to eliminate the sense amplifier contention problem.

The present invention will be described by way of example for a 16 M DRAM memory array. However, the present invention may be applied to other memory arrays of different sizes, for example 64 M, 256 M, 1 G, etc. Further, although described in terms of redundant wordlines, the present invention may also be applicable to redundant bitlines. In a preferred embodiment of the invention, a memory bank includes four memory sub-units, however any combination of sub-units, memory banks and number of redundant elements is possible depending on the size, architecture and design of the memory device/bank.

Figure 3:
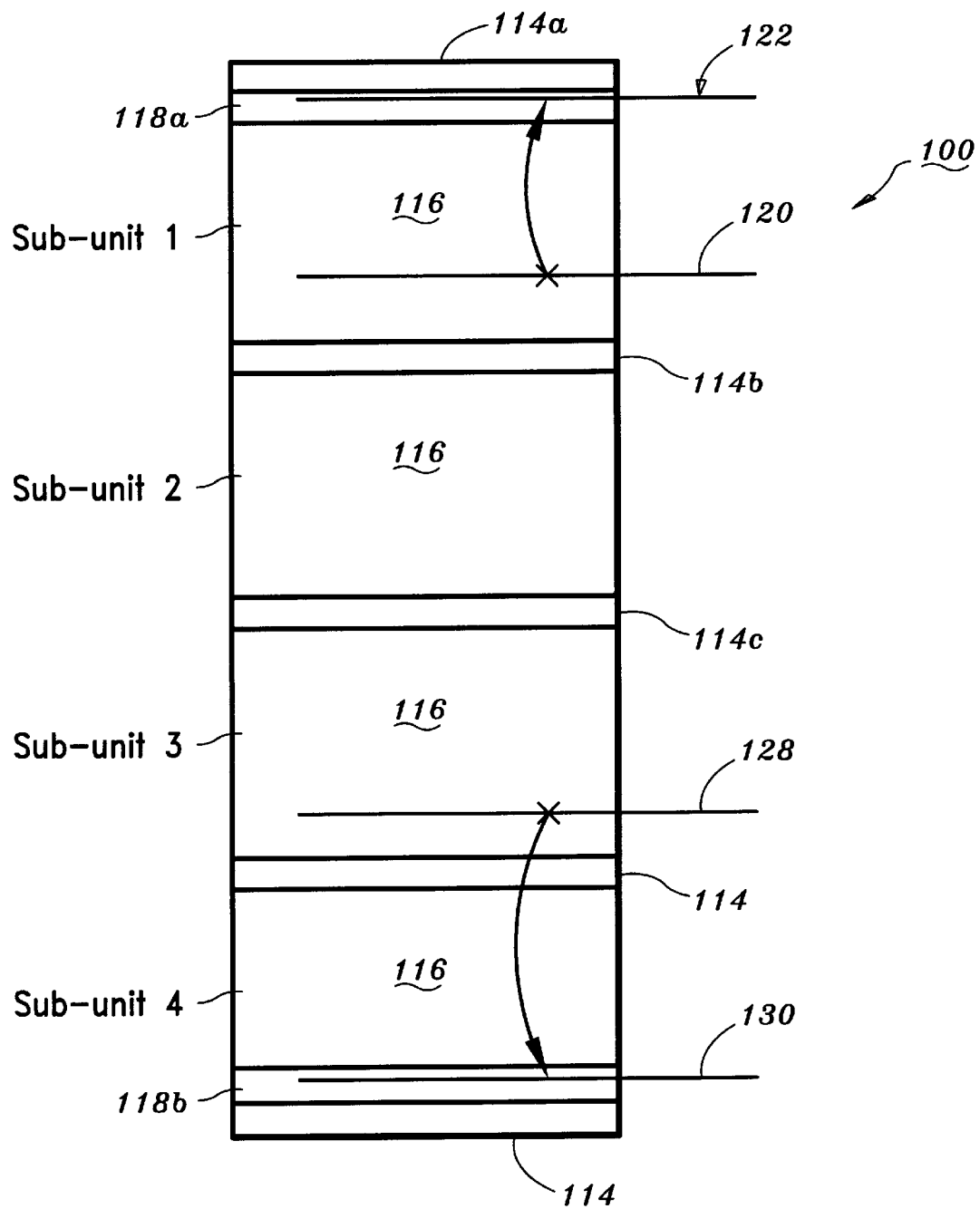
FIG. 3 is a schematic diagram of a memory bank having a distributed block redundancy for repairing faulty elements in accordance with the present invention, showing a 1 M and 4 M domain repair of a faulty WL.

Referring now in specific detail to the drawings in which like reference numerals identify similar or identical elements throughout the several views, and initially to FIG. 3, a distributed block redundancy memory 100 is shown in accordance with the present invention. Memory 100 comprises, for example, 16 megabits (M) of memory in a single 16 M bank. Memory 100 is divided into four sub-units (sub-units 1–4) each having, for example, 4 M of memory. Sense amplifiers 114 and memory arrays 116 are included. Sense amplifiers 114 are shared between adjacent sub-units, for example sub-unit 1 and sub-unit 2 share sense amplifiers disposed therebetween. Redundancies 118 are preferably distributed toward opposite ends of memory 100, for example in sub-unit 1 and in sub-unit 4. Redundancies 118 are shown for rows only in FIG. 3, however redundant columns may also be used in a similar manner. Redundancies 118 are incorporated in sub-units 1 and 4, i.e., no separate redundancy region is needed as in block redundancy designs, and the redundancies are also not evenly distributed over all four sub-units as in distributed redundancy designs. In this way, redundant logic circuitry and sense amplifiers are no longer needed. Thus, chip area is conserved and the layout becomes more area efficient. In this illustrative example, redundancies 118 include 8 to 32 redundant wordlines (RWL), preferably 16 RWLs, per 4 M sub-unit which may be clustered together or distributed in a predetermined manner across their respective sub-unit. More or less redundant wordlines may be included as required by the design.

Sense amplifiers 114 are shared between adjacent sub-units for memory layouts. For example, sense amplifiers may be shared between sub-unit 1 and sub-unit 2, as described. However, according to the present invention sense amplifier contention is avoided using the following repair method. For illustrative purposes, the present invention will be described having faulty wordlines. An active wordline 120 in sub-unit 1 is faulty and replaced by a redundant wordline 122 also in sub-unit 1. For both redundant wordline 122 and active wordline 120, the same sense amplifier banks are used, namely 114a and 114b. In accordance with the present invention, redundant elements are clustered in redundant blocks 118 within their respective sub-units. Note that sub-units 2 and 3 do not include any redundancy. Instead, sub-units 1 and 2 share the redundancy 118a of sub-unit 1 and sub-units 3 and 4 share redundancy 118b of sub-unit 4. Due to this distribution of redundancy, a repair of a faulty wordline is always away from a central sense amplifier sub-unit 114c.

Figure 1:
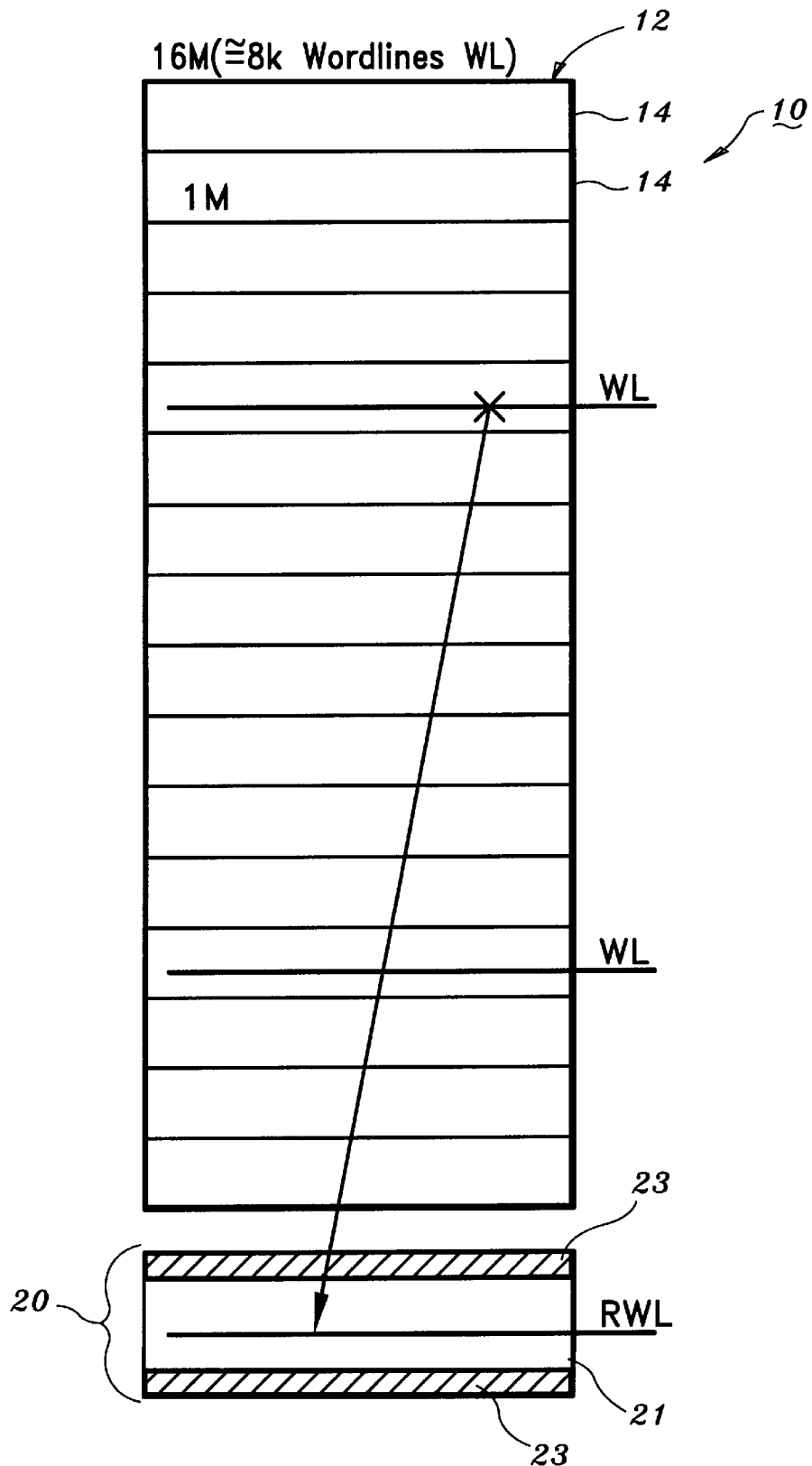
FIG. 1 is a schematic diagram of a memory bank having a block redundancy for repairing faulty elements in accordance with the prior art.
Figure 2:
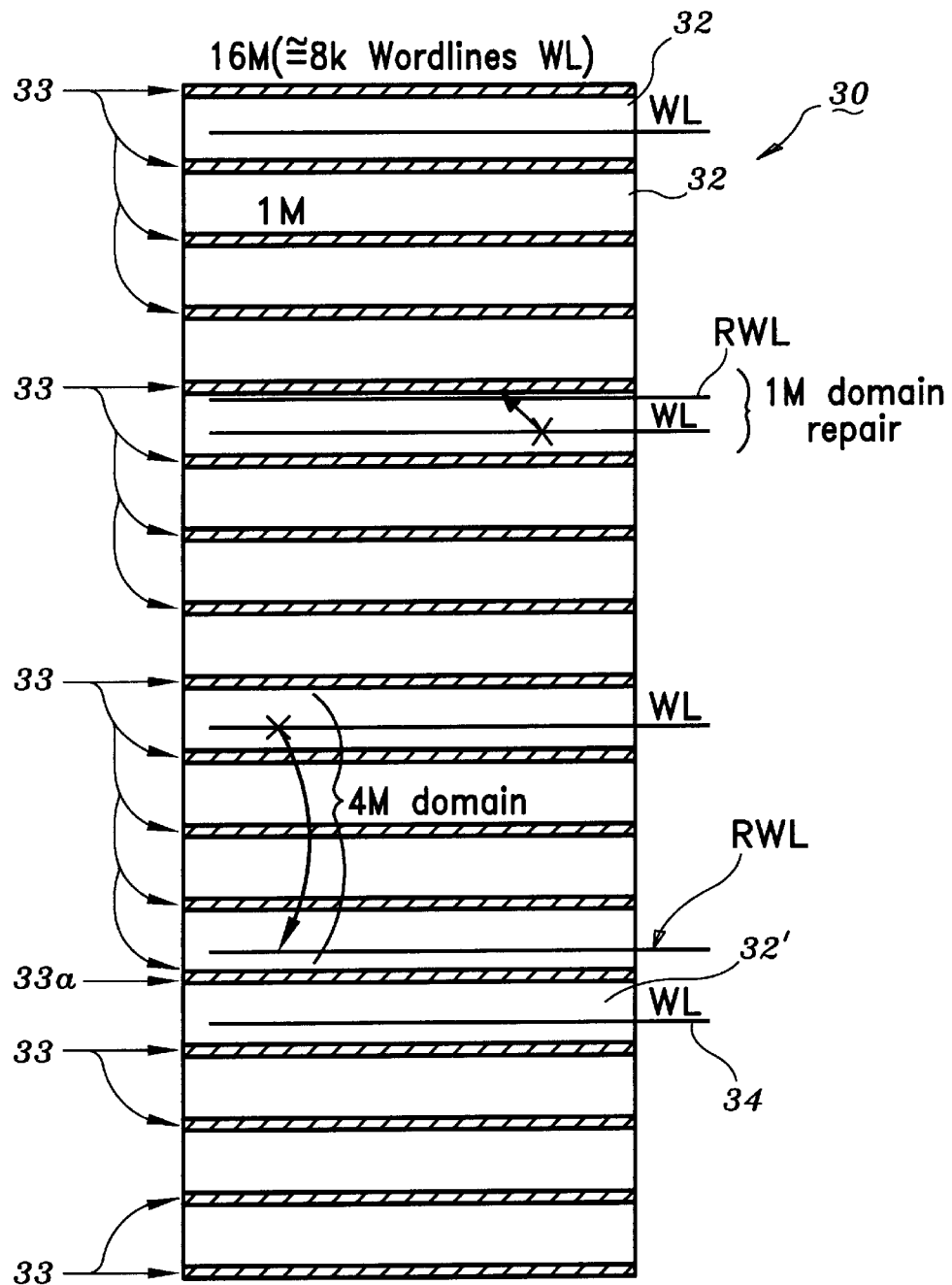
FIG. 2 is a schematic diagram of a memory bank having a distributed redundancy for repairing faulty elements in accordance with the prior art.

A faulty wordline 128 in sub-unit 3 is replaced by a redundant wordline 130 in sub-unit 4. As described, the present invention calls for repairs away from central sense amplifier bank 114c. As opposed to the distributed redundancy approach described in FIG. 2 of the prior art, in accordance with the invention, redundant wordline 130 does not employ central sense amplifier bank 114c and therefore no sense amplifier contention occurs as a result of replacement of faulty wordlines. In fact, employing the distributed block redundancy in accordance with the present invention, provides a highly flexible repair domain of about one half the total memory. In this example, the repair domain is 8 M.

Having described preferred embodiments for a novel distributed block redundancy for memory devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A memory bank comprising:

a plurality of memory sub-units, each memory sub-unit being divided by sense amplifier banks wherein adjacent memory sub-units share the sense amplifier bank therebetween;

redundancy regions, disposed in the memory sub-units and sharing circuitry therewith, being located at a first end portion and a second end portion of the memory bank, the first and second end portions being disposed at opposing ends of the memory bank; and a central sense amplifier bank disposed between a first half and a second half of the memory bank wherein failed devices in the first half of the memory bank are replaced by a device in the redundancy region at the first end portion and failed devices in the second half of the memory bank are replaced by a device in the redundancy region at the second end portion such that sense amplifier contention is prevented for the central sense amplifier bank.

2. The memory bank as recited in claim 1, wherein the redundancy regions include word lines.

3. The memory bank as recited in claim 1, wherein each memory sub-unit includes 4 megabits of memory.

4. The memory bank as recited in claim 1, further comprises a repair domain of one half of a total memory of the bank.

5. The memory bank as recited in claim 1, wherein each memory sub-unit includes 16 megabits of memory.

6. The memory bank as recited in claim 1, wherein each redundancy region includes 8 to 32 redundant wordlines per 4 megabits of memory.

7. The memory bank as recited in claim 1, wherein each redundancy region includes logic circuitry, the logic circuitry being shared between the redundancy region and the memory sub-unit in which the redundancy region is disposed.

8. The memory bank as recited in claim 1, wherein the redundancy regions share sense amplifiers with the memory sub-unit in which the redundancy region is disposed.

9. A memory bank comprising:

a plurality of memory sub-units, each memory sub-unit being divided by sense amplifier banks wherein adjacent memory sub-units share the sense amplifier bank therebetween;

a first redundancy disposed within a first memory sub-unit and employed for replacing failed devices in the first memory sub-unit and a second memory sub-unit adjacent to the first memory sub-unit;

a second redundancy disposed within a fourth memory sub-unit and employed for replacing failed devices in the fourth memory sub-unit and a third memory sub-unit adjacent to the fourth memory sub-unit; and the first memory sub-unit and the fourth memory sub-unit being separated by the second and third memory sub-units, the second and third memory sub-units sharing a central sense amplifier bank therebetween wherein the failed devices are replaced by redundant devices which use sense amplifier banks other than the central sense amplifier bank.

10. The memory bank as recited in claim 9, wherein the redundancy includes word lines.

11. The memory bank as recited in claim 9, wherein each memory sub-unit includes 4 megabits of memory.

12. The memory bank as recited in claim 9, further comprises a repair domain of one half of a total memory of the bank.

13. The memory bank as recited in claim 9, wherein each memory sub-unit includes 16 megabits of memory.

14. The memory bank as recited in claim 9, wherein the first and second redundancy include 8 to 32 redundant wordlines per 4 megabits of memory.

15. The memory bank as recited in claim 9, wherein the first redundancy includes logic circuitry, the logic circuitry being shared between the first redundancy and the first sub-unit.

16. The memory bank as recited in claim 9, wherein the second redundancy includes logic circuitry, the logic circuitry being shared between the second redundancy and the fourth sub-unit.

17. The memory bank as recited in claim 9, wherein the first redundancy shares sense amplifiers with the first sub-unit.

18. The memory bank as recited in claim 9, wherein the second redundancy shares sense amplifiers with the fourth sub-unit.

19. A method for replacing failed devices in semiconductor memories comprising the steps of:

providing a memory bank including a plurality of memory sub-units, each memory sub-unit being divided by sense amplifier banks wherein adjacent memory sub-units share the sense amplifier bank therebetween;

providing redundancy regions in the memory sub-units at a first end portion and a second end portion of the memory bank, the first and second end portions being disposed at opposing ends of the memory bank;

preventing sense amplifier contention of a central sense amplifier bank disposed between a first half and a second half of the memory bank by:

replacing failed devices in the first half of the memory bank by replacing the failed device by a device in the redundancy region at the first end portion; and replacing failed devices in the second half of the memory bank by replacing the failed device by a device in the redundancy region at the second end portion.

20. The method as recited in claim 19, further comprises the step of sharing circuitry and devices between the redundancy regions and the memory sub-unit in which the redundancy region is located.

21. The method as recited in claim 19, wherein the redundancy regions include word lines.

22. The method as recited in claim 19, further comprises the step of providing a repair domain of one half of a total memory of the bank by implementing the method.

* * * * *